United States Patent
Muraoka et al.

[11] Patent Number: 6,059,887
[45] Date of Patent: May 9, 2000

[54] PROCESS FOR CLEANING THE INTERIOR OF SEMICONDUCTOR SUBSTRATE

[75] Inventors: Hisashi Muraoka; Hiroshi Tomita; Soichi Nadahara, all of Yokohama; Norio Kobayashi, Shibata, all of Japan

[73] Assignees: Purex Co., Ltd., Yokohama; Kabushiki Kaisha Toshiba, Kawasaki; Toshiba Ceramics Co., Ltd., Tokyo, all of Japan

[21] Appl. No.: 09/054,511

[22] Filed: Apr. 3, 1998

[30] Foreign Application Priority Data

Apr. 3, 1997 [JP] Japan ................................. 9-101030

[51] Int. Cl.[7] ............................................. C03C 23/00
[52] U.S. Cl. ............................................................. 134/2
[58] Field of Search ................................ 135/2, 5; 75/401, 75/402; 423/348, 508; 148/242; 134/2

[56] References Cited

U.S. PATENT DOCUMENTS

| | | | |
|---|---|---|---|
| 3,650,823 | 3/1972 | Mead et al. | 117/201 |
| 3,993,533 | 11/1976 | Milnes et al. | 156/6 |
| 4,078,942 | 3/1978 | Luisi et al. | 134/10 |
| 4,094,731 | 6/1978 | Keyser et al. | 23/295 R |
| 4,284,428 | 8/1981 | Canning, Jr. | 75/402 |
| 4,288,246 | 9/1981 | Banski et al. | 75/402 |
| 4,612,179 | 9/1986 | Sanjurjo et al. | 423/348 |
| 4,645,546 | 2/1987 | Matsushita | 148/33 |
| 4,769,058 | 9/1988 | McMaster | 65/104 |
| 4,828,814 | 5/1989 | Sanjurjo et al. | 75/433 |
| 5,015,509 | 5/1991 | Rey | 427/431 |
| 5,066,359 | 11/1991 | Chiou | 438/471 |
| 5,089,082 | 2/1992 | Dreier et al. | 252/62.3 R |
| 5,141,563 | 8/1992 | Colon et al. | 134/2 |
| 5,377,398 | 1/1995 | Bessey | 29/81.07 |
| 5,505,786 | 4/1996 | Cole et al. | 134/2 |

FOREIGN PATENT DOCUMENTS

| | | | |
|---|---|---|---|
| 51-57641 | 11/1974 | Japan | 134/2 |
| 1299008 | 10/1984 | U.S.S.R. | 134/2 |
| 565567 | 11/1944 | United Kingdom | 134/2 |

*Primary Examiner*—Randy Gulakowski
*Assistant Examiner*—Yolanda E. Wilkins
*Attorney, Agent, or Firm*—Oblon, Spivak, McClelland, Maier & Neustadt, P.C.

[57] ABSTRACT

A process of cleaning the interior of a semiconductor substrate containing metallic impurities therein is provided. The semiconductor substrate is heated, with one side or the both sides thereof being in contact with a melt of a metal or an inorganic salt, at a high temperature such that the melt does not react with these semiconductor and the semiconductor is not melted. By this process, the impurities present inside the substrate are removed out of the substrate and the interior thereof is cleaned.

19 Claims, 4 Drawing Sheets

PROCESS FOR CLEANING THE INTERIOR OF SEMICONDUCTOR SUBSTRATE

BACKGROUND OF THE INVENTION

1. Field of the Invention

This invention relates to a process for cleaning the interior of a semiconductor substrate. More particularly, it relates to a cleaning process for removing rapidly-diffusible metallic impurities from the interior of a semiconductor substrate.

2. Description of the Prior Art

Contamination of semiconductor substrates with heavy metal impurities in the fabrication of MOS devices or bipolar structure devices on the surface of substrates of a semiconductor such as silicon often causes serious problems, such as the lowering of breakdown strength of the oxide film and the increase of leak currents through pn junctions. Cu and Ni, in particular, are so rapidly diffusible in silicon that they can cause great effects on the devices. Moreover, the contamination due to such metals is liable to occur during the operation of processing apparatus as well as before and after the operation.

Accordingly, as a technique for isolating such metallic impurities from device active regions of semiconductor substrates, methods called intrinsic gettering (IG) and extrinsic gettering (EG) are known in the art. These are methods in which crystal defect layers or thin-film layers capable of readily absorbing metallic impurities are provided in regions other than the device active regions so that the metallic impurities are made to move from the device active regions to these layers in the step of heating and are captured there.

Since the above gettering action is very strong in purification of the device active regions, any contaminant metallic elements coming from processing apparatus at each fabrication step are captured in the gettering sites more and more with the progress of processing. Especially in the steps of ion implantation and dry etching, the contamination may so much occur that the function of gettering may become saturated or closely saturated to result in a less effective gettering action with the progress of the process.

In addition, the metallic impurities once gettered may be liberated to again enter the device active regions. For example, elements, such as Cu that are fairly rapidly diffusible even at 300° C. or below, are liberated from saturated or closely saturated gettering layers under some heating conditions during the processing.

In the IG, portions with a low oxygen concentration in the gettering layers have defects of a relatively low degree and hence combine with Cu so weakly that the metallic impurities are quite easily liberated (re-liberation) even at 300° C. or below. Microdefects with a high oxygen concentration have a strong power to capture Cu, and hence such re-liberation is not significant below 300° C. but easy at about 500° C.

In the EG, when the layer that captures metallic impurities is a processing defect layer formed on the back, the re-liberation of metallic impurities tends to occur at a relatively low temperature. When the layer that captures metallic impurities is a polysilicon layer on the back, the re-liberation occurs in heating at a high temperature.

Hence, even when the gettering mechanism is provided, the impurities captured in the gettering regions are preferably as small as possible in amounts.

SUMMARY OF THE INVENTION

Accordingly, an object of the present invention is to provide a cleaning process that can remove metallic impurities from the inside of a semiconductor substrate to the outside to purify the interior of the substrate.

To achieve this object, the present invention provides a cleaning process comprising the step of:

bringing a melt of a metal or an inorganic salt into contact with one side or the both sides of a substrate of a semiconductor containing metallic impurities in its interior; and heating, in that state of contact, the semiconductor substrate and the melt at a high temperature within the range where the semiconductor substrate does not react with the melt and the semiconductor substrate is not melted, to thereby remove the metallic impurities from the interior of the semiconductor substrate.

Conventional semiconductor substrate cleaning processes for heavy-metal contamination having ill effects on semiconductor devices is only effective for cleaning the surfaces of semiconductor substrates, whereas the present invention makes it possible to clean the interior of semiconductor substrates.

In addition, even in semiconductor substrates having a strong gettering site, harmful metals such as Cu and Ni captured in its gettering regions can be washed away. Furthermore, Na present in oxide films can also be removed.

The present invention can be applied in the step of fabricating devices, whereby the gettering ability of a substrate can be beforehand held back from approaching its saturation and the heavy metals captured by a gettering site can be prevented from being again liberated in the subsequent relatively low-temperature steps and from contaminating the surface-area device active regions. As the result, the gettering ability possessed by the substrate can be always displayed at its maximum.

The cleaning process using the melt according to the present invention can be put into practice with a simple apparatus. Unlike the conventional substrate cleaning processes, no harmful gases or liquid wastes are not produced.

When a melted inorganic salt which is impossible of oxidation, is used as a cleaner, the process of the invention can be carried out in the air. Furthermore, since no oxide film is formed on the surface of the liquid melt, metallic impurities can transfer from the interior of a substrate to the melt readily and smoothly.

Since the melted inorganic salt has a small surface tension, the entire surface thereof is flat even at its peripheral parts in contact with the walls of a vessel containing the salt; therefore, the vessel can be made compact. Since melted inorganic salts have smaller specific gravities than melted metals, they are easy to handle. Moreover, the melted inorganic salts are transparent, so that immersion treatment can be conducted more easily. In general, melted inorganic-salts can be recycled easily. In particular, inorganic salts which is well soluble in a hot water but slightly soluble in a cooled water can be purified easily by recrystallization.

DESCRIPTION OF THE PREFERRED EMBODIMENTS

Figure 1:
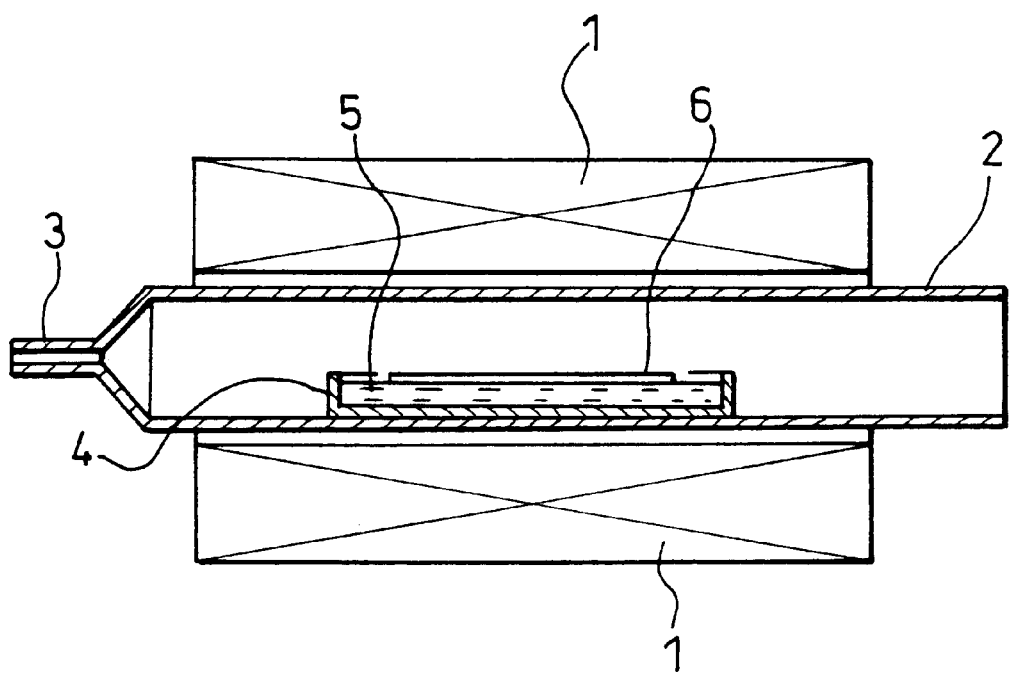
FIG. 1 schematically illustrates an example of a cleaning apparatus used to carry out the process of the present invention.

The present invention will now be described in detail below.

Semiconductor Substrate

The substrate to be cleaned may be a substrate present at any stages of the process of producing substrates or at any stages of the process of fabricating devices, without any particular limitations. The present invention can be applied to any semiconductor substrates whose interiors are contaminated with metallic impurities. More specifically, it can be applied to any substrates available before devices are fabricated in the device active regions of the substrate, in the course of their fabrication and after their fabrication. In the semiconductor substrate, gettering structure such as IG or EG may not be formed or it may have been formed. An oxide film may have been formed on the surface on which devices are to be fabricated, and further a polysilicon film may have been formed on the oxide film.

The semiconductor substrate may be exemplified by a silicon substrate. There are no particular limitation on the thickness of the substrate. The present invention can of course be applied to those usually used, having a thickness of 500 to 800 $\mu$m.

The metallic impurities that is present in the interior of a substrate and to be removed by the process of the present invention, are those which diffuse in the semiconductor substrate at a diffusion coefficient of at least $5 \times 10^{-8}$ cm$^2$/sec under a temperature in heat treatment. Typical metallic impurities include Cu, Ni and Fe. The temperature at which these metallic impurities exhibit the above diffusion coefficient in the silicon substrate, i.e., preferable heating temperature, may be 250° C. or above, more preferably 300° C. or above, still more preferably 400° C. or above, and further still more preferably 450° C. or above for Cu; 450° C. or above, more preferably 500° C. or above, and still more preferably 550° C. or above for Ni; and 500° C. or above, more preferably 550° C. or above, and still more preferably 600° C. or above for Fe. Since a harmful metal Na captured in the oxide film which is liable to be formed on silicon substrate is also diffusible at a rapid rate, the effects of the present invention can be obtained at a temperature of 500° C. or above, preferably 600° C. or above.

Melted Metal

The melt which can be used as a cleaner according to the present invention is a melt of a metal or an inorganic salt, which are herein sometimes referred to melted metal or melted salt.

Metals which can be used for the melt are required not to react with the semiconductor for the substrate at a temperature of the heat treatment, for example, at 300° C. or higher where the semiconductor is silicon. The metals include, for example, Bi (m.p.: 271° C.), Cd (m.p.: 321° C.), Pb (m.p.: 327° C.), Sn (m.p.: 232° C.), Tl (m.p.: 300° C.), Zn (m.p.: 419° C.) and the like, and alloys of two or more of these metals. Among the metals, preferred are Bi, Pb, Sn, Tl and alloys of two or more of these metals. Most preferred are Pb, Sn and alloys thereof in view of cleaning performance and economical performance.

Melted Salt

Melted salts which can be used for the melt are required not to react with the semiconductor for the substrate at a temperature of the heat treatment, for example, at 300° C. or higher where the semiconductor is silicon. The inorganic salts include, for example, halides such as chlorides and iodides of Pb, Tl, Ag, and Sn. Among the inorganic salts, preferred are PbCl$_2$ (m.p.: 501° C.; b.p.: 954° C.), TlCl$_2$ (m.p.: 427° C.; b.p.: 806° C.), AgCl$_2$ (m.p.: 449° C.; b.p.: 1554° C.), SnCl$_2$ (m.p.: 247° C.; b.p.: 623° C.), PbI$_2$ (m.p.: 402° C.; b.p.: 954° C.), and mixtures of two or more of these inorganic salts, and most preferred is PbCl$_2$.

The temperature for the heating (or heat treatment) of the semiconductor substrate and melt in contact may be appropriately selected in accordance with the kind of the melt, the type of the metallic impurities, and the type of the semiconductor substrate. The temperature is so selected as described above in view of diffusion coefficients of metallic impurities, and additionally it is of course required to be higher than the melting point of the metal or inorganic salt to be melted. As to the upper limit of the temperature, it is required that the melt does not react with the semiconductor for the substrate and that the semiconductor is not dissolved in the melt when the melt is a melted metal. Specifically, the temperature for the heat treatment is selected from the range of 300° C. to 800° C. so as to meet the requirements of an individual instance.

As far as the cleaning performance is concerned, the temperature for the heat treatment is desirably as high as possible, unless any disadvantage arises. However, in the fabrication of ultra LSI, it is a trend that devices become minuter increasingly and temperatures for fabrication processes becomes lower; thus, normally a temperature of 450 to 700° C. is used.

The time for the heat treatment may be selected appropriately according to the kind of the melt and the temperature for heat treatment, and it may be normally about 3 to 60 minutes.

When the present process is applied to a step of a device fabrication process, the melt is desirably brought into contact with the back surface only of a wafer (substrate) so that the side of the mirror surface on which devices are to be formed may hardly be affected. On the other hand, however, when the melt is allowed to be brought into contact with both the sides of a wafer as in a material production process or when a wafer to be brought into contact with the melt in a device fabrication process has an oxide film on its mirror surface side only, the wafer is allowed to be immersed in the melt, resulting in improvement of cleaning performance and reduction of time necessary for contact.

For removing Cu, a Sn melt and a Pb melt as well as a PbCl$_2$ melt are effective. For removing Ni, a Sn melt and a PbCl$_2$ melt are most effective. Also, for removing Fe, a Sn melt and a PbCl$_2$ melt exhibit good cleaning performance.

The cleaning performance of each melt varies as described above depending on an impurity element to be removed. To allow the cleaning performance of each melt to exhibit effectively, an alloy of two or more metals or a mixture of two or more inorganic salts can be used as necessary. Sn is an expensive metal but effective in removing Ni and Fe present in the interior of a wafer substrate; on the other hand, Pb is effective in removing Cu. Therefore, a melt of a Pb—Sn alloy is a preferable melt.

No metals must not remain on the wafer after the heating treatment with the wafer being contact with a melt. Although metals and conditions have been selected such that reaction with silicon does not occur, some metal may often attach to a part of the surface of a silicon wafer due to a stain on the back side surface of the wafer and oxidation products on the melt surface. The melted metal thus attached can be removed by blowing a heated inactive gas with a temperature slightly higher than that of the melt at a high rate. However, a Pb melt attaching to a wafer cannot be removed so completely as a Sn melt. In that case, the melt attached to the silicon wafer needs to be dissolved off with an acidic chemical. If the acid treatment is carried out using a sulfuric acid heated to 200° C. or higher, not only the attached melt can be certainly removed but also metallic impurities remaining inside the substrate after the treatment with the melt can be further removed.

The metal or inorganic salt constituting the melt is preferably as highly pure as possible with regard to impurities other than semiconductor-constituting elements. Specifically, the concentration of each metallic impurities is preferably about 1 ppm or below. Products commercially available as having a purity of 99.99% or higher, preferably 99.999% or higher, can be normally used for the present invention.

In general, the heating according to the present process is preferably conducted in a non-oxidative atmosphere. In particular, the heating of the semiconductor substrate and a melted metal in contact is normally carried out in a non-oxidative atmosphere, e.g., in an atmosphere of inert gas such as argon or nitrogen, as well as in vacuo. An oxide film is liable to be formed on the surface of the melted metal during the heating treatment. Such a oxide film is required to be removed prior to the contact of the melted metal with the substrate, because the oxide film obstructs metallic impurities from transferring from the substrate to the melted metal.

The use of a melted inorganic salt as a cleaner enables the heat treatment in the air, since mostly it is not oxidized. Some halides may be oxidized, however, to produce a mixture containing oxides with a higher melting point, which worses processability. In such cases, a non-oxidative atmosphere is preferred.

The heating of the semiconductor substrate and melt in contact with each other as described above results in a marked decrease in the quantity of metallic impurities captured in the interior of the substrate not only of IG wafers having a high oxygen concentration of, e.g., $1.5 \times 10^{18}$ atoms/cc but also of IG wafers with a polysilicon film formed on the back.

Cleaning with Sulfuric Acid

After the step of heating the semiconductor substrate and solid cleaner in contact, the semiconductor substrate is preferably further brought into contact with a heated sulfuric acid. In this cleaning with sulfuric acid, the metallic impurities having been liberated from the gettering site in the heating step described above but have not completely transfered to the melt, transfer into the sulfuric acid to make the interior cleaning further proceed. Here, even if some Cu has been diffused from the melt to the semiconductor substrate, the capturing force for the Cu exerted by the gettering site is so weak that most of the Cu transfer to the sulfuric acid.

As the sulfuric acid, it is preferable to use concentrated sulfuric acid with a high purity. The concentrated sulfuric acid may preferably have a purity of 99.99% or higher with regard to impurities other than water. In particular, metallic impurities is preferably in a concentration of not more than 1 ppm, and more preferably not more than 1 ppb.

There are no limitations on how to bring the semiconductor substrate into contact with the sulfuric acid. Is normally sufficient to treat the semiconductor substrate previously with hydrofluoric acid to remove natural oxide films and thereafter to immerse the substrate in a sulfuric acid. The sulfuric acid is normally at a temperature of 200° C. or above but below the boiling point of the sulfuric acid, and preferably from 250 to 300° C. The semiconductor substrate may be brought into contact with the sulfuric acid at such a temperature normally for 3 to 20 minutes.

Applicability

The present invention can be applied at any stages having a possibility of contamination with metallic impurities, e.g., in the step of preparing wafers to produce the semiconductor substrates, in the step of making the IG or EG gettering site, in the step of fabricating devices and after the fabrication of devices. When applied in the step of making the gettering site and in the steps of thermal oxidation, thermal diffusion, ion implantation, dry etching and so forth where the contamination may frequently occur, the gettering ability of the substrates will be kept for later steps and can be well exhibited in the step of fabricating devices.

EXAMPLES

The present invention will now be described in greater detail with reference to Examples, to which the present invention is by no means limited.

Sample Substrates

The effect of the present invention was confirmed by radioactive tracer technique. Cu labeled with $^{64}$Cu (half life: 12.8 hours), Ni Labeled with $^{57}$Ni (half life: 36 hours), Fe labeled with $^{59}$Fe (half life: 45 days) and Na labeled with $^{24}$Na (half life: 15 hours), were used in the examples. These labeled elements were hereinafter simply referred to as "$^{64}$Cu", "$^{57}$Ni", "$^{59}$Fe" and "$^{24}$Na", respectively.

In the following description, in regard to the oxygen concentration of silicon substrates, "low oxygen concentration" is meant to be an oxygen concentration of about $1.2 \times 10^{18}$ atoms/cc, and "high oxygen concentration" an oxygen concentration of about $1.5 \times 10^{18}$ atoms/cc.

As substrate samples, silicon wafers of the following types were prepared.

(1) High oxygen concentration CZ wafer: A p-type (100) and about 10 Ω cm silicon wafer of 650 μm in thickness, having the high oxygen concentration but having no gettering structure.

(2) High oxygen concentration HI wafer: A silicon wafer provided with IG structure inside thereof formed by heating said CZ wafer of (1) in an atmosphere of hydrogen at 1,200° C.

(3) High oxygen concentration BSP wafer: A high oxygen concentration wafer provided with a polysilicon film on the back, prepared by forming the polysilicon film on the back of said CZ wafer of (1) by CVD of monosilanes.

(4) High oxygen concentration HIBSP wafer: A high oxygen concentration HI wafer provided with EG structure of a polysilicon on the back, prepared by forming the polysilicon film as mentioned above on the back of the HI wafer of (2) above.

(5) BSD wafer: A EG wafer prepared by forming a mechanical damage layer on the back of said CZ wafer of (1).

(6) CZO wafer: A wafer prepared by forming a CVD oxide film of 1,000 Å in thickness on the mirror surface of said CZ wafer of (1).

The reason why silicon of p-type was used for the silicon wafers is that, in conventional surface cleaning processes, Cu as a contaminant on p-type surfaces is known to be removed with more difficulty than Cu on n-type silicon surfaces.

Sample Substrates Containing Cu as an Impurity

Each wafer described above was immersed in a $^{64}$Cu-added buffered hydrofluoric acid solution ($NH_4F+HF$) to allow $^{64}$Cu to be adsorbed on the substrate surface so as to give a $^{64}$Cu average concentration of $1 \times 10^{13}$ atoms/cm$^2$ on the substrate surface. Each wafer thus treated was then heated in an atmosphere of Ar at 900° C. for 30 minutes to make the $^{64}$Cu diffuse into the substrate. Thus substrate samples were prepared.

Measurement of radioactivity revealed the following quantity and state of distribution of the $^{64}$Cu present in the interiors of these substrate samples.

The average quantity per cm$^2$ of $^{64}$Cu having entered the interior was determined to be about $2\times10^{13}$ atoms/cm$^2$ in all the substrates. Since the wafers were about 650 μm thick, the average $^{64}$Cu concentration in the substrates was about $3\times10^{14}$ atoms/cc.

The distribution of $^{64}$Cu concentration along the depth in cross section of the substrates was measured to find the following:

In the high oxygen concentration HI substrate, about 90% of the entire in-diffused $^{64}$Cu was captured in the IG region.

In the HIBSP substrate, about 90% of the entire in-diffused $^{64}$Cu was captured in IG the region, and the rest was captured in the vicinity of the back surface Sample Substrate Containing Ni as an Impurity Since no Ni radioisotope emitting a gamma ray with an energy intensity suited to radioactive tracer technique was available commercially, $^{57}$Ni was produced based on the reaction $^{56}$Fe(3He, 2n)$^{57}$Ni by means of a cyclotron. Since $^{57}$Ni was obtained in a small amount, 20 mm×20 mm square chips which were cut out from the high oxygen concentration HI wafer and the high oxygen concentration HIBSP wafer, were immersed in a $^{57}$Ni-added dilute SC-1 (NH$_4$OH:H$_2$O$_2$:H$_2$O=1:1:50 by volume), thereby $^{57}$Ni being adsorbed on the surfaces of the silicon chips. Subsequently, heating at 900° C. was carried out for 30 minutes to produce substrate samples in which $^{57}$Ni was captured. The concentration of $^{57}$Ni in the interiors of the substrate samples was measured to be $2\times10^{12}$ atoms/cm$^2$.

Sample Substrates Containing Fe as an Impurity

A high oxygen concentration HI wafers and high oxygen concentration HIBSP wafers were each immersed in a $^{59}$Fe-added SC-1 (NH$_4$OH:H$_2$O$_2$:H$_2$O=1:1:5 by volume), thereby $^{59}$Fe being adsorbed on the silicon surface. Subsequently, heating at 900° C. was carried out for 30 minutes to produce substrate samples in which $^{59}$Fe was captured. The concentration of $^{59}$Fe in the interiors of the substrate samples was measured to be $3\times10^{13}$ atoms/cm$^2$.

Evaluation of Cleaning Ability

Cleaning ability for Cu was evaluated in the following way. First, $^{64}$Cu was diffused into substrate samples at 900° C. for 30 minutes. The average quantity (A) per cm$^2$ of the $^{64}$Cu having entered the interior of the substrates was determined by radioactivity measurement. Next, the substrates thus contaminated with $^{64}$Cu were each subjected to the cleaning by contact heating and/or the heated sulfuric acid treatment, and thereafter the average quantity (B) per cm$^2$ of the $^{64}$Cu remaining in the substrates was determined by radioactivity measurement. Its percentage to the quantity of $^{64}$Cu before the cleaning treatment, i.e., Cu retention, B/A (%), was calculated to indicate the cleaning ability for interior contaminant metals.

Cleaning ability for Ni and Fe was evaluated in the same way as the case of Cu except that the $^{64}$Cu was replaced with $^{57}$Ni and $^{59}$Fe.

Cleaning ability for Ni, Fe and Na was evaluated in the same manner as in the case of Cu.

EXAMPLE 1

Silicon substrates were cleaned with melted Sn using the apparatus shown in FIG. 1. As the substrates to be cleaned, were used the substrate samples prepared by thermal diffusion of $^{64}$Cu into the high oxygen concentration CZ wafer (1) and the high oxygen concentration HI wafer (2) as described above. The substrate samples were treated as described below.

In a quartz tube 2 with a cubic shape in cross section placed in an electric resistance heating furnace 1, a highly pure Ar gas was introduced through an inlet 3. Sn 5 with a purity of 99.999% put in EL quartz plate 4 was heated and melted in this atmosphere. After the temperature inside the tube 2 reached 600° C., a small amount of oxides floating on the melt surface was removed with a stirring rod. Subsequently, a wafer 6 to be cleaned was placed and floated on the surface of the melted Sn with the back surface being in contact with the melt. The wafer was treated under that conditions for 3 minutes. The same treatment was repeated except for the treatment time was changed from 3 minutes to 10 minutes or 20 minutes.

After the treatment, the treated wafer was taken out of the apparatus. A small amount of Sn adhering on the back of the wafer could be readily removed by blowing a N$_2$ gas heated with a flash air heater (tradename: HIHEATER, supplied by Kabusiki Kaisha Hibeck) onto the back. No change was observed on the back of the wafer visually with naked eyes.

Figure 2:
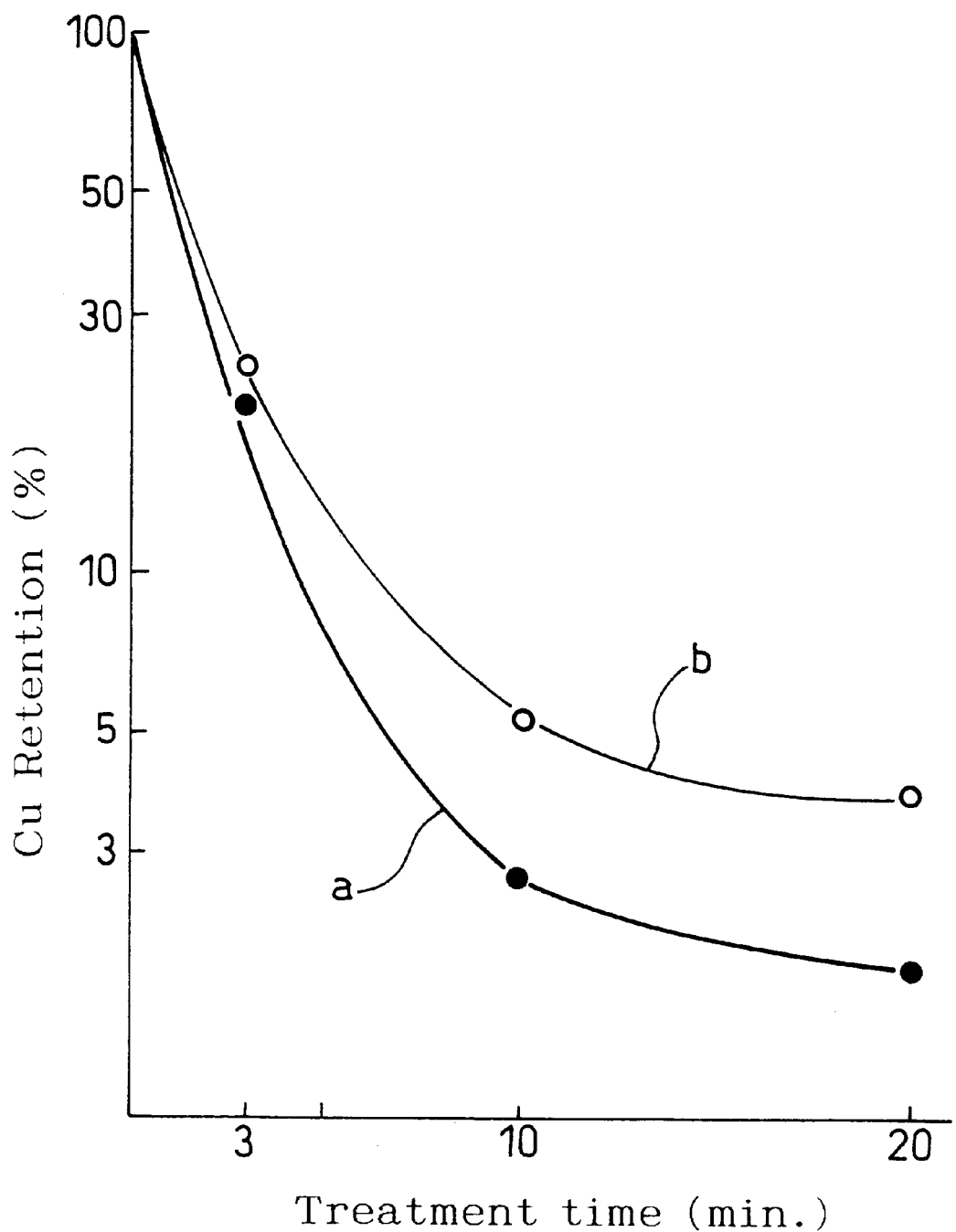
FIG. 2 shows the results of cleaning obtained in Example 1.

The relationship between the $^{64}$Cu retention in the treated wafers and the treatment time was shown in FIG. 2. The curve a shows the results of treatment of the Cu in-diffused high oxygen concentration CZ wafer, and the curve b shows the results of treatment of the Cu in-diffused high oxygen concentration HI wafer.

As shown in FIG. 2, 95% or more of the Cu which was present in the interior of any wafers was removed by the heat treatment with melted Sn at 600° C. for 10 minutes.

EXAMPLE 2

Figure 3:
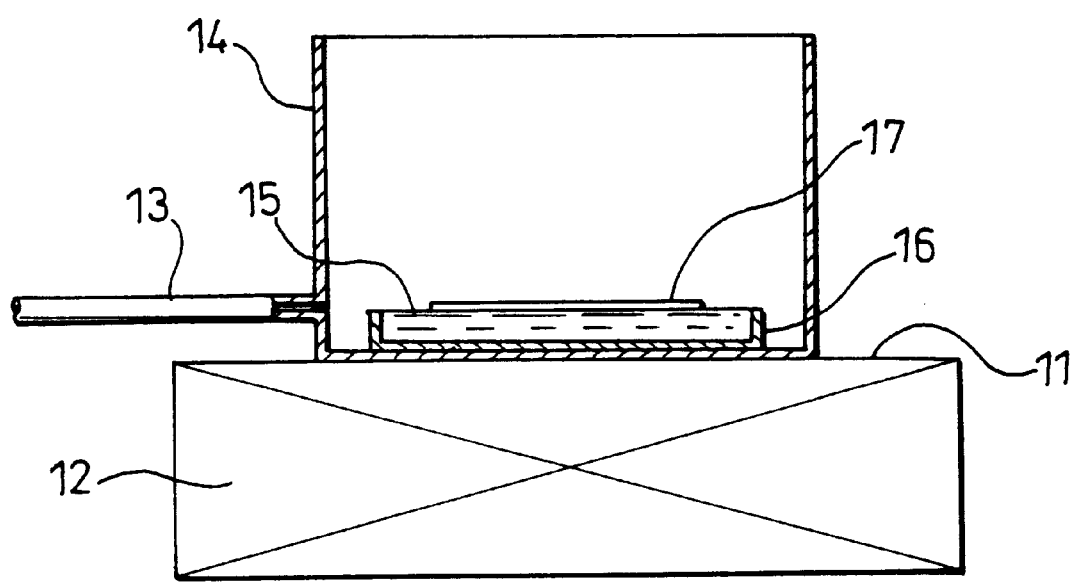
FIG. 3 schematically illustrates another example of a cleaning apparatus used to carry out the process of the present invention.

Silicon substrates were cleaned with melted Pb using the apparatus shown in FIG. 3. Since it was difficult in the apparatus used in Example 1 to confirm whether the surface of the melted Sn became clean when oxides floating on the melt surface was attempted to be cleaned, the apparatus depicted in FIG. 3 was used for this example. Each substrate was treated as below.

A quartz vessel 14 with an inlet 13 for Ar gas was placed on the evenly heated surface 11 of a resistance heater 12. The heating surface 11 was controlled to have a desired temperature. In the quartz vessel 14, a quartz plate 16 containing a Pb 15 with a purity of 99.999% was placed.

After the Pb was melted, in order to remove oxide films on the surface of the melt, a quartz tube having an end sealed flatly was inserted into the melted Pb filled in the quartz plate 16 to allow a surface part of the melted Pb to overflow the quartz plate 16, and further the overflowing was promoted with the aid of a quartz spatula. Thus, a melted Pb surface with metallic luster was uncovered. After it was confirmed with a surface thermometer that the melt surface was controlled at 500° C., a substrate 17 to be treated was floated on the melt surface with the mirror side up and the back side being in contact with the melt surface. The wafer was treated under that conditions for 20 minutes.

The substrate samples prepared by diffusing Cu into the high oxygen concentration HI wafer (2), high oxygen concentration HIBSP wafer (4) and BSD wafer (5), as described above, were subjected to the heat treatment above.

After the treatment, the treated wafer was taken out of the apparatus, and then a heated N$_2$ gas was blown onto the wafer in the same manner as in Example 1. When melted Pb is used as a cleaner, Pb attaching to the substrate may not be completely detached by blowing N$_2$ gas. Therefore, after measurement of the residual $^{64}$Cu in the wafer, the wafer was immersed in a hot concentrated sulfuric acid at 300° C. and cleaned for 10 minutes. After thorough removal of the sulfuric acid and cooling to room temperature, the wafer was overflow rinsed with ultrapure water and then dried with a spinner. The wafer thus treated was subjected to measurement of $^{64}$Cu residue in the wafer, and $^{64}$Cu retention was sought. The results are given in Table 1.

TABLE 1

| Type of $^{64}$Cu in-diffused substrate | $^{64}$Cu retention (%) after cleaning treatment | |
|---|---|---|
| | After treatment with melted Pb | After treatment with heated sulfuric acid |
| High oxygen concentration HI | 3.6 | 1.5 |
| High oxygen concentration HIBSP | 7.6 | 3.1 |
| BSD | 5.0 | 2.1 |

According to the results in Table 1, Pb exhibited an equivalent performance to Sn used in Example 1 in removing Cu out of HI wafer. Although the difference in apparatus might somewhat affect, taking into account the fact that the treatment temperature in this example was lower by 100° C. than that in Example 1 and that melted Pb attached to the back of wafers more strongly than melted Sn, it is presumed that Pb is significantly more effective than Sn in removing performance for Cu.

The cleaning with sulfuric acid markedly reduced the $^{64}$Cu retention. This effect may not be attributed to only the sulfuric acid because some Pb remained on the back of the wafer.

EXAMPLE 3

Heat treatment of substrates with melted Sn was conducted in the same manner as in Example 1, except that the substrate samples were replaced with the Ni in-diffused chips prepared by thermal diffusion of Ni into the chips cut out from the high oxygen concentration HI wafer (2) and the high oxygen concentration HIBSP wafer (4) as described above and that temperature for heating was changed to 500° C. The two types of chips each held in a frame of quartz were pushed into the melted Sn and immersed therein for 20 minutes. After the heat treatment, a heated N$_2$ was blown onto the chips to remove Sn attached on the chips in the same manner as in Example 1. Subsequently, the chips were measured for $^{57}$Ni residues by radioactive tracer technique, and was then subjected to cleaning with sulfuric acid at 300° C. for 10 minutes. The chips thus treated were measured again for $^{57}$Ni residues. The $^{57}$Ni retention sought from the results are as given in Table 2.

TABLE 2

| Type of $^{57}$Ni in-diffused substrate | $^{57}$Ni retention (%) after cleaning treatment | |
|---|---|---|
| | After treatment with melted Sn | After treatment with heated sulfuric acid |
| High oxygen concentration HI | 15.7 | 8.7 |
| High oxygen concentration HIBSP | 28.9 | 15.4 |

Heat treatment of substrates with a melt was conducted in the same manner as in Example 2, except that the substrate samples were replaced with the Fe in-diffused substrate samples prepared by thermal diffusion of Fe into the high oxygen concentration HI wafer (2) and the high oxygen concentration HIBSP wafer (4) as described above and that the melted Pb was replaced with a melted alloy of Pb 60% and Sn 40%. Results are given in Table 3.

TABLE 3

| Type of $^{59}$Fe in-diffused substrate | $^{59}$Fe retention (%) after cleaning treatment |
|---|---|
| High oxygen concentration HI | 73 |
| High oxygen concentration HIBSP | 79 |

A quartz beaker with flat bottom was placed on a temperature controlled heater, and lead chloride was melted therein and kept at 520° C. Two types of Cu-contaminated wafers, $^{64}$Cu in-diffused high oxygen concentration CZ wafers (1) and $^{64}$CU in-diffused high oxygen concentration BSP wafers (3) were floated on the melted lead chloride with the mirror surface up and the back surface in contact with the melted lead chloride. The two types of wafers above were treated under that conditions for 3 minutes, 10 minutes and 20 minutes. After the treatment, heated N$_2$ gas is blown onto the wafers in the same manner as in Example 1 in an attempt to remove some melt attaching to the back surface. Subsequently, the wafers were cooled to room temperature and then washed with hot water to remove lead chloride completely.

Figure 4:
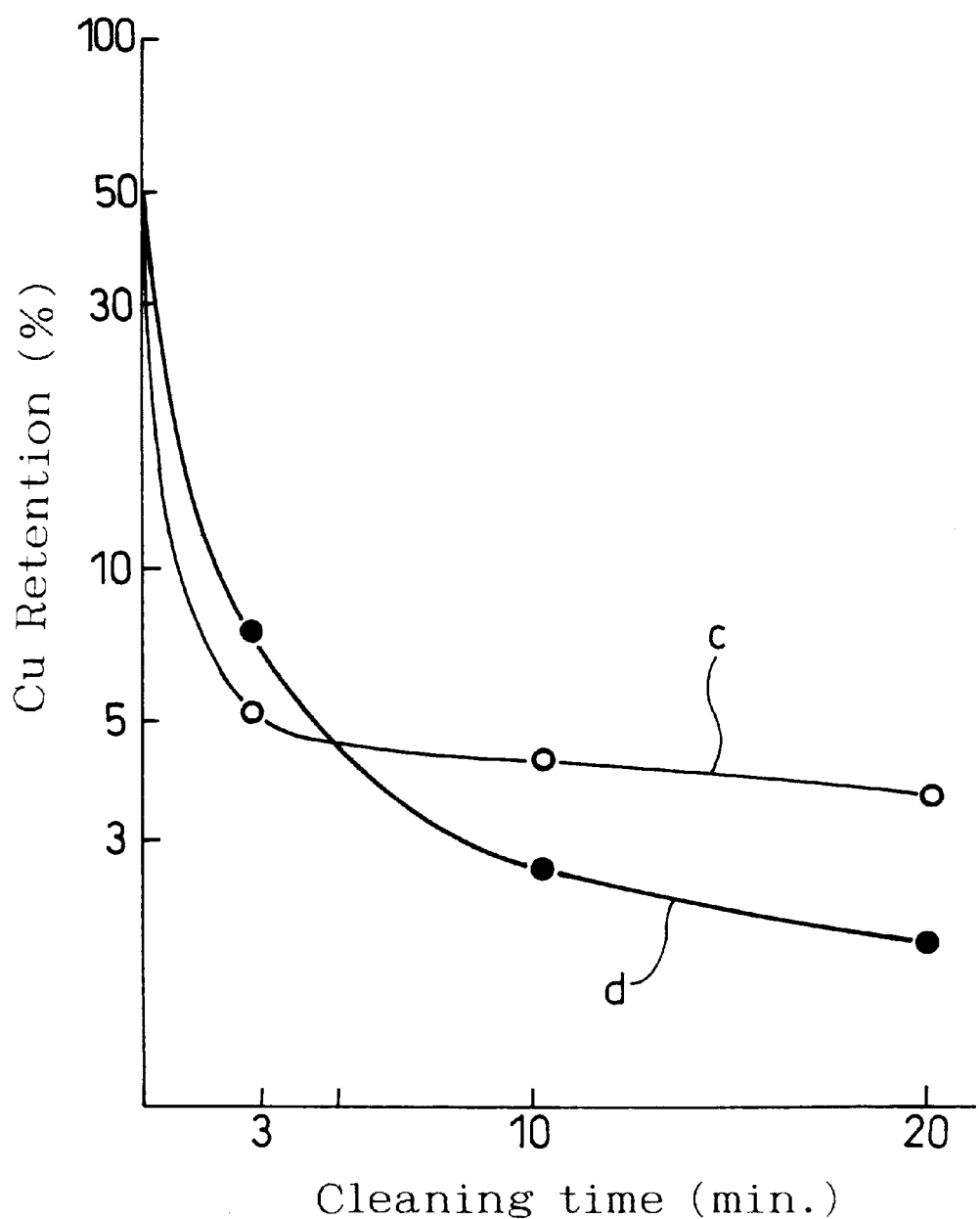
FIG. 4 shows the results of cleaning obtained in Example 5.

Subsequently, the wafers thus treated were measured for $^{64}$Cu residue. The results are depicted in FIG. 4 in which the curve c shows the result of high oxygen concentration CZ wafer and the curve d shows the result of high oxygen concentration BSP wafer.

A substrate sample prepared as above by diffusing $^{64}$Cu into the high oxygen concentration HI wafer (2) was treated in the same manner as above, provided that heating was carried out only for 20 minutes. $^{64}$Cu retention in the thus treated wafer was measured to be 14.8%. A substrate sample of the same type was immersed in the melted lead chloride at 520° C. for 20 minutes using a quartz carrier. In this case, $^{64}$Cu retention was measured to be 8.2%.

EXAMPLE 6

The back surfaces of substrate samples prepared as described above by diffusing $^{59}$Fe into the high oxygen concentration BSP wafer (3) were treated in contact with melted PbCl$_2$, TlCl$_2$ or AgCl$_2$ at 520° C. for 20 minutes in the same manner as in Example 5. $^{64}$Cu retention of the wafers thus treated was measured. The results are as given in Table 4.

TABLE 4

| Melted salt | PbCl$_2$ | TlCl$_2$ | AgCl |
|---|---|---|---|
| $^{59}$Fe retention | 16% | 38% | 42% |

EXAMPLE 7

One ppm of $^{64}$Cu was added to 1 ml of a melted lead chloride at 520° C., and 15 mm ×15 mm square chip cut out from the high oxygen concentration HI wafer (2) was immersed in the $^{64}$Cu—added melt for 20 minutes. After the treatment, heated $N_2$ gas is blown onto the chip in the same manner as in Example 1. Subsequently, the chip was cooled to room temperature and then washed with hot water to remove lead chloride completely.

The amount of $^{64}Cu$ diffused in the chip thus treated was measured by counting radioactivity to find that it is lower than the detectable limit of $10^{12}$ atoms/cc.

This result shows that if contamination of a melt with Cu is increased by repetition of the cleaning of many substrates with the melt, there is no possibility that substrates to be cleaned are contaminated due to the melt.

EXAMPLE 8

A CZO wafer (6) mentioned above was left in Ar at 900° C. containing a steam of NaCl labeled with $^{24}Na$ for 30 minutes, to form an oxide film containing $^{24}Na$ at a concentration of about $10^{13}$ atoms/cc on the wafer surface. The wafer thus treated was immersed in a melted $PbCl_2$ in the same manner as described in the last part of Example 5, provided that the temperature of the melted $PbCl_2$ was changed to 600° C. According to measurement after the treatment, $^{24}Na$ retention in the wafer was determined to be 11%. Thus, rapidly diffusible impurities in oxide films can also be removed according to the present invention.

What is claimed is:

1. A cleaning process comprising the step of:
   bringing a melt of a metal or an inorganic salt into contact with one side or the both sides of a substrate of a semiconductor containing metallic impurities in its interior; and
   heating, in that state of contact, the semiconductor substrate and the melt at a temperature within the range where the semiconductor substrate does not react with the melt and the semiconductor substrate is not melted and where said metallic impurities diffuse in the semiconductor substrate at a diffusion coefficient of at least $5 \times 10^{-8} cm^2/sec$, to thereby remove the metallic impurities from the interior of the semiconductor substrate.

2. The process according to claim 1, wherein said semiconductor substrate is a silicon substrate.

3. The process according to claim 1, wherein said semiconductor substrate is a substrate before devices are fabricated in the device active regions thereof, a substrate in the course of the fabrication of devices or an substrate after the fabrication of devices.

4. The process according to claim 1, wherein said semiconductor substrate has a gettering structure inside or outside the substrate.

5. The process according to claim 1, wherein said metallic impurities comprise Cu and the step of said heating is carried out at a temperature of 250° C. or higher.

6. The process according to claim 5, wherein the step of said heating is carried out at a temperature of 450° C. to 700° C.

7. The process according to claim 1, wherein said metallic impurities comprise Ni and the step of said heating is carried out at a temperature of 450° C. or higher.

8. The process according to claim 1, wherein said metallic impurities comprise Fe and the step of said heating is carried out at a temperature of 500° C. or higher.

9. The process according to claim 1, wherein said substrate has an oxide film containing Na and the step of said heating is carried out at a temperature of 500° C. or higher.

10. The process according to claim 1, wherein said metal for the melt is Bi, Cd, Pb, Sn, Tl, Zn or an alloy of two or more of these metals.

11. The process according to claim 10, wherein said metal for the melt is Bi, Pb, Sn, Tl or an alloy of two or more of these metals.

12. The process according to claim 10, wherein said metal for the melt is Pb, Sn or an alloy of these metals.

13. The process according to claim 1, wherein said inorganic salt for the melt comprises a halide of Pb, Tl, Ag, or Sn, or a mixture of two or more of the halides.

14. The process according to claim 13, wherein said inorganic salt for the melt is $PbCl_2$, $TlCl_2$, $AgCl_2$, $SnCl_2$ or $PbI_2$ or a mixture of two or more of these salts.

15. The process according to claim 13, wherein said metal for the melt is $PbCl_2$.

16. The process according to claim 1, wherein said step of heating is carried out in a non-oxidative atmosphere.

17. The process according to claim 1, wherein said melt is a melted inorganic salt and said step of heating is carried out in the air.

18. The process according to claim 1, wherein said process further comprises, after the step of heating, the step of bringing the semiconductor substrate into contact with a heated sulfuric acid.

19. The process according to claim 18, wherein said heated sulfuric acid has a temperature of 200° C. or higher.

* * * * *